United States Patent [19]
Ishii et al.

[11] 3,956,037
[45] May 11, 1976

[54] METHOD OF FORMING SEMICONDUCTOR LAYERS BY VAPOR GROWTH

[75] Inventors: Takashi Ishii; Kazuhisa Takahashi; Akihiro Kondo, all of Amagasaki, Japan

[73] Assignee: Mitsubishi Denki Kabushiki Kaisha, Tokyo, Japan

[22] Filed: Apr. 11, 1974

[21] Appl. No.: 460,052

[30] Foreign Application Priority Data
Dec. 26, 1973  Japan................................. 49-2161

[52] U.S. Cl............................... 148/189; 148/186; 148/175
[51] Int. Cl.². .......................................... H01L 7/44
[58] Field of Search ............ 148/189, 175; 117/201, 117/106 A

[56] References Cited
UNITED STATES PATENTS

| | | | |
|---|---|---|---|
| 3,170,825 | 2/1965 | Schaarschmidt..................... | 148/175 |
| 3,328,213 | 6/1967 | Topas ................................ | 148/175 |
| 3,612,958 | 10/1971 | Saito et al....................... | 148/175 X |

*Primary Examiner*—G. Ozaki
*Attorney, Agent, or Firm*—Oblon, Fisher, Spivak, McClelland & Maier

[57] ABSTRACT

A method of forming a second semiconductor layer on a first semiconductor layer by vapor growth is disclosed. The two semiconductor layers are of the same conduction type but have different impurity concentrations. In the forming process, a doping gas is supplied before the vapor growth of the second semiconductor layer is started whereby a steep impurity distribution is established in the vapor-growth boundary.

6 Claims, 14 Drawing Figures

METHOD OF FORMING SEMICONDUCTOR LAYERS BY VAPOR GROWTH

BACKGROUND OF THE INVENTION

1. Field of the Invention:

The present invention relates to a method of forming one semiconductor layer on another semiconductor layer by a vapor growth process, the impurity concentration of the two semiconductor layers being different from one another.

2. Description of the Prior Art:

The rapidly expanding demand for solid-state electronic devices and apparatus in recent years has been accelerating the development of advanced semiconductor elements. Greater efficiency and reliability, and operability at higher frequencies are the major quality expected of modern semiconductor devices, especially in the field of bipolar integrated circuits, high speed variable capacitance elements, high frequency transistors, and microwave diodes. These elements are usually fabricated by depositing a semiconductor layer on a low- or high-resistance semiconductor substrate, with the crystal structures aligned. (Such a semiconductor layer will hereinafter be referred to as an epitaxial layer.)

In a semiconductor element where the semiconductor substrate is of a low-resistance wafer, a loose impurity distribution takes place in the boundary between the wafer and the epitaxial layer due to a phenomenon called autodoping. The presence of a region of loose impurity distribution hampers the attainment of accuracy in designing a semiconductor element, and increases the series resistance, as well as the thermal resistance, thereby resulting in degradation of operating efficiency and reliability.

One prior art approach to the problem of the autodoping phenomenon was the two-step epitaxial growth technique which had been developed by the inventors of this invention through hydrodynamic analysis on effects incidental to the autodoping phenomenon. This approach, however, was likely to give rise to a depression in the impurity distribution due to excess intermediate heat treatment or to a residue of the autodoped region due to insufficient intermediate heat treatment. To preclude this problem, the process of heat treatment had to be under strict control, which in turn required a volume of preliminary experimental data and specialized skill as well.

Another problem in the prior art still exists. That is, when the semi-conductor substrate is a high-resistance wafer, a loose impurity distribution occurs in the boundary between the wafer and the epitaxial layer due to a phenomenon named autodilution, which is a term defined opposite to the autodoping phenomenon.

SUMMARY OF THE INVENTION

Accordingly, it is an object of the present invention to provide a new and improved unique method of forming a semiconductor layer by vapor growth, of which the impurity concentration level and impurity profile is controlled.

Another object of the present invention is to provide a new and improved unique method of forming a second semiconductor layer on a first semiconductor layer by vapor growth, the impurity concentration being different in the two semiconductor layers, and wherein the impurity distribution is made steep in the boundary of the vapor grown layer by controlling the impurity concentration level.

Another object of the present invention is to provide a new and improved unique method of forming a second semiconductor layer on a first semiconductor layer by vapor growth, the impurity concentration being different in the two semiconductor layers, and wherein the impurity concentration level is controlled by supplying a carrier gas and a doping gas of a given concentration before vapor growth of the second semiconductor layer is started.

Another object of the subject invention is to provide a new and improved unique method of forming a second semiconductor layer on a first semiconductor layer by vapor growth, the impurity concentration being higher in the second semiconductor layer than in the first semiconductor layer, and wherein the impurity distribution is made steep in the boundary region.

Still another object of the instant invention is to provide a new and improved unique method of forming a semiconductor layer directly on a semiconductor substrate by vapor growth, the impurity concentration being higher in the semiconductor layer than in the substrate.

A still further object of the present invention is to provide a new and improved unique method wherein a first semiconductor layer is formed on a semiconductor substrate by vapor growth, the impurity concentration being lower in the first semiconductor layer than in the semiconductor substrate, a carrier gas and a doping gas are supplied, heat treatment is applied, and thus the impurity concentration level is controlled, and then a second semiconductor layer is formed on the first semiconductor layer by vapor growth, the impurity concentration being lower in the second semiconductor layer than in the substrate.

Yet one other object of this invention is to provide a new and improved unique method wherein a carrier gas, a doping gas, and a source gas are supplied onto a semiconductor substrate and thereby a first semiconductor layer is formed on the substrate by vapor growth, the impurity concentration being lower in the first semiconductor layer than in the substrate, the supply of only the source gas is stopped, heat treatment is applied, and thus the impurity concentration level is controlled, and then a carrier gas, a doping gas, and a source gas are supplied onto the first semiconductor layer and thereby a second semiconductor layer is formed on the first semiconductor layer by vapor growth.

BRIEF DESCRIPTION OF THE DRAWINGS

A more complete appeciation of the invention and many of the attendant advantages thereof will be readily apparent as the same becomes better understood by reference to the following detailed description when considered in connection with the accompanying drawings, wherein.

DETAILED DESCRIPTION OF THE PREFERRED EMBODIMENTS

Figure 1:
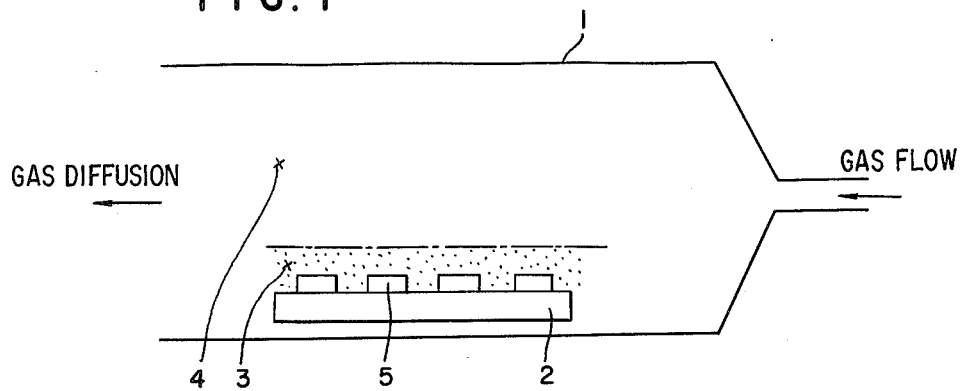
FIG. 1 is a schematic diagram showing the state of gas flow in a reaction tube of a horizontal type vapor growth apparatus.

The drawings will now be referred to hereinafter with like reference numerals or characters referring to identical or corresponding parts throughout the several views. Preferred forms of structures which embody the invention will be described in contrast to prior art structures.

Initially, for the sake of explanatory simplicity, a method of forming an epitaxial layer having a low impurity concentration on a semiconductor substrate having a high impurity concentration will be described by referring to FIGS. 1 through 8.

Assume that an arsenic-doped silicon epitaxial layer is formed on an arsenic-doped silicon substrate by a deposition technique. This is a typical example where it is very likely that the autodoping phenomenon, will be caused. Moreover, in this example it is likely that a depression in the impurity distribution in the boundary during a heat treatment process will occur. The reason why these phenomena occur in the arsenic doping process is because the vapor pressure of arsenic is considerably higher than that of another impurity element used on the semiconductor.

Referring now to FIG. 1, there is shown a state of gas flow in a reaction tube 1 placed in a horizontal type silicon vapor growth furnace which is widely used for industrial purposes. A hydrodynamic analysis shows that the flow of gas in the tube 1 is not uniform but is split into two layers; a very thin stagnant layer 3 on a heater 2 (hereinafter referred to as susceptor), and a convection layer 4. The stagnant layer is produced due to flow resistance and thermal force in the atate where the temperature is rising by heating. In the stagnant layer the gas flow is substantially stopped, while in the convection layer the flow of silicon source gas, doping gas and carrier gas are constant. These gases are then carried away out of the tube. Hydrides and halides such as $SiH_4$, $SiCl_4$, $SiHCl_3$, and $SiH_2Cl_2$ may be used for the silicon source gas. Arsenic tihydride $AsH_3$ (Arsine) and hydrogen $H_2$ are usually used for the doping gas and the carrier gas respectively. A silicon epitaxial layer is formed in such manner that the molecules of the gases are diffused in the stagnant layer 3 from the convection layer 4 and then subjected to thermal decomposition or reduction on the surface of a highly arsenic-doped silicon substrate 5 placed on the susceptor 2 whereby silicon and arsenic are deposited on the substrate 5.

Before epitaxial growth starts, the silicon substrate 5 is exposed to high temperature heat and thereby caused to evaporate arsenic at a high vapor pressure. The evaporated atoms do not promptly flow out of the reaction system but stay within the stagnant layer. Only some arsenic atoms are diffused in the convection layer from the stagnant layer and carried away off the reaction system at a rate so far lower than the rate at which arsenic is evaporated from the silicon substrate 5 that the concentration of the arsenic in the stagnant layer does not become substantially lowered. The doping gas, $AsH_3$, in an amount required for the epitaxial layer to provide arsenic of a desired concentration is diffused in the stagnant layer 3 from the convection layer 4 and held therein. This doping gas is thermally decomposed into atomic-state arsenic on the surface of the substrate 5. The concentration of arsenic atoms evaporated from the silicon substrate 5 and stagnated therein is far higher than the predetermined necessary concentration of the doping gas being supplied. When epitaxial growth takes place on the silicon substrate 5, the excess arsenic atoms in the stagnant layer 3 are redeposited on the substrate 5, together with silicon atoms. As a result, an excess amount of arsenic atoms are doped into the silicon epitaxial layer, with the result that the concentration of arsenic becomes far greater than the value needed for the silicon epitaxial layer formed in the beginning of epitaxial growth. These are the effects of the autodoping phenomenon.

Figure 2:
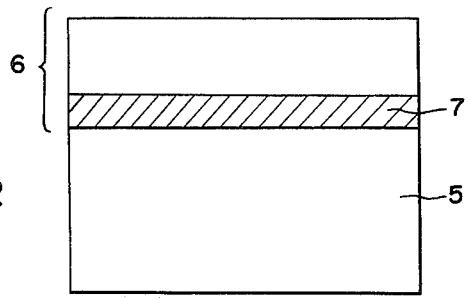
FIG. 2 is a sectional view showing the structure of a wafer wherein an epitaxial layer having a low impurity concentration is formed on a substrate having a high impurity concentration by a usual epitaxial growth process.
Figure 3:
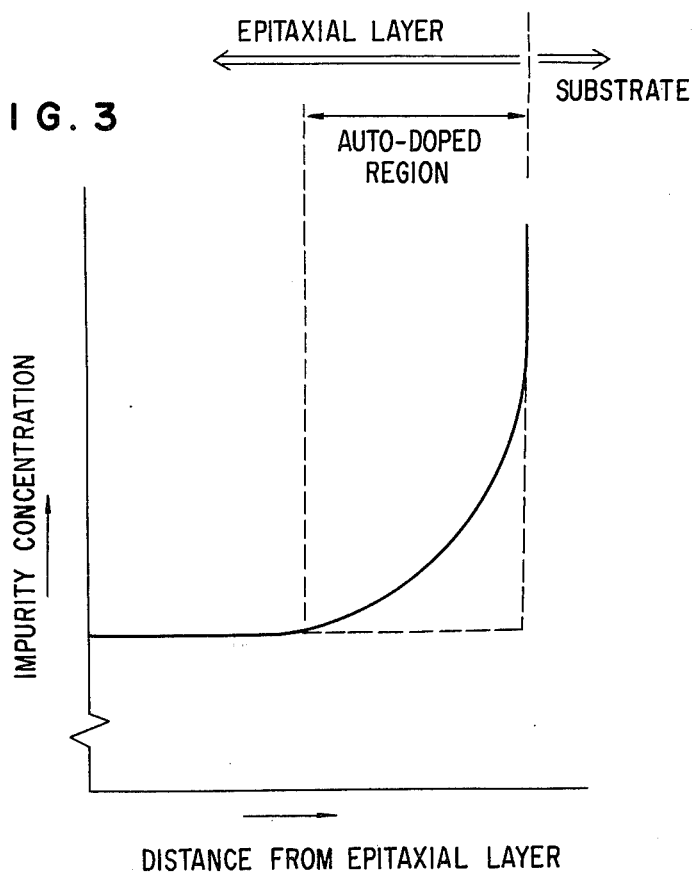
FIG. 3 is a diagram showing an impurity distribution in the wafer as in FIG. 2.

Referring now to FIG. 2, a silicon epitaxial wafer is shown as fabricated in a conventional manner of epitaxial growth. In FIG. 2, the numeral 6 denotes an epitaxially grown layer, and 7 an auto-doped region formed in the boundary. This epitaxial wafer assumes an impurity distribution as indicated by the solid line in FIG. 3. Note that the broken line in FIG. 3 indicates an ideal impurity distribution obtained under the condition that no autodoping takes place.

Figure 4A:
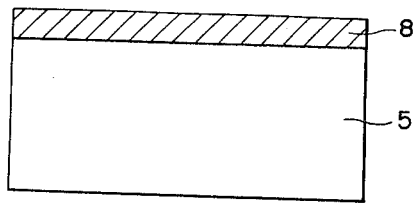
FIG. 4(a) is a sectional view of an epitaxial wafer comprising a first epitaxial layer formed by a two-step epitaxial growth technique.
Figure 4B:
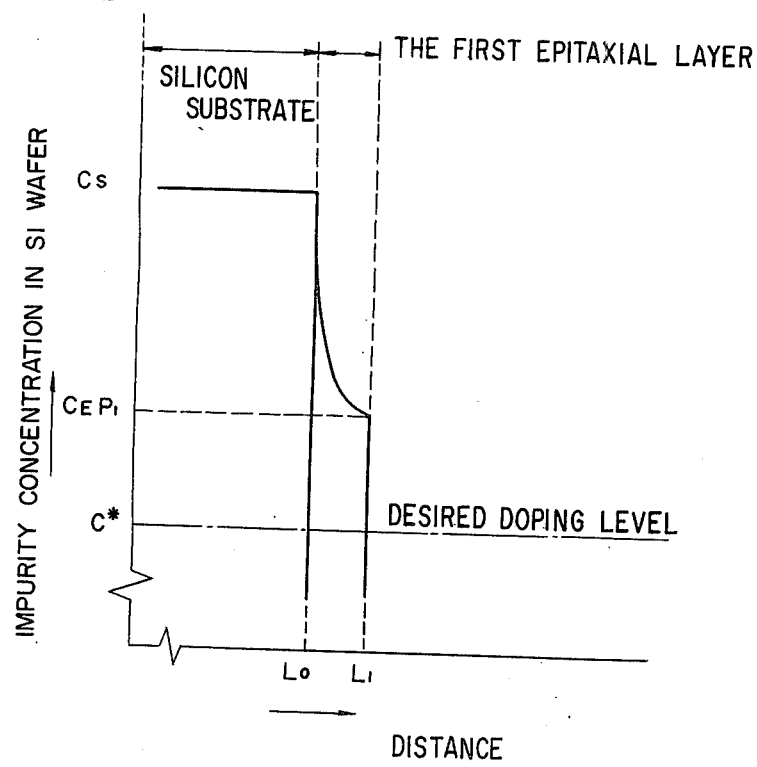
FIG. 4(b) is a diagram showing an impurity distribution in the wafer as in FIG. 4(a).

According to the two-step epitaxial growth technique, the epitaxial growth process comprises a first epitaxial growth step and a second epitaxial growth step. Between the two steps is an interval where the growth is suspended to allow a process for heat treatment. In the heat treatment, the first epitaxial layer which is deposited thinly on the silicon substrate 5 is subjected to heat treatment and, at the same time, the residue of gases in the reaction tube is cleaned. FIG. 4(a) shows a state where the first epitaxial layer 8 is deposited thinly on the silicon substrate 5. The first epitaxial layer 8 is doped with arsenic to the level $CEP_1$, as shown in FIG. 4(b), and is far higher than the desired level $C^*$. The thickness of the first epitaxial layer 8 is $(L_1 - L_0)$ which is normally below 1 micron. Although the level $CEP_1$ is far higher than the level $C^*$, it is still low enough in comparison with the arsenic concentration level in the silicon substrate 5. Hence the first epitaxial layer 8 serves to restrain further evaporation of arsenic at a high concentration from the silicon substrate 5. In the heat treatment process, after the first epitaxial growth step, the supply of silicon source gas and doping arseniuretted hydrogen gas is stopped to allow only the carrier hydrogen gas to be fed to the reaction tube. In this process, the temperature in the reaction tube is kept constant at the same temperature throughout the whole process including the first and second epitaxial growth and the heat treatment between them.

Figure 5A:
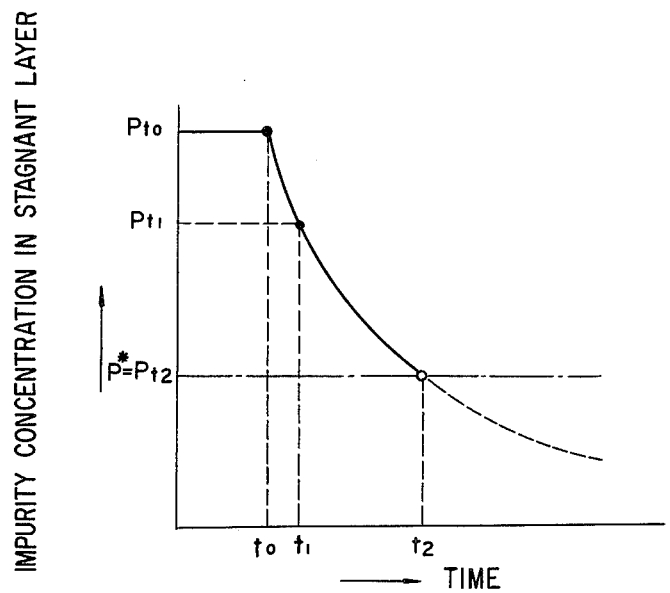
FIGS. 5(a) and 5(b) are diagrams showing changes in the concentration of an impurity added thereto in a vapor phase and in a solid phase, in the step of the heat treatment process according to the two-step epitaxial growth technique.
Figure 5B:
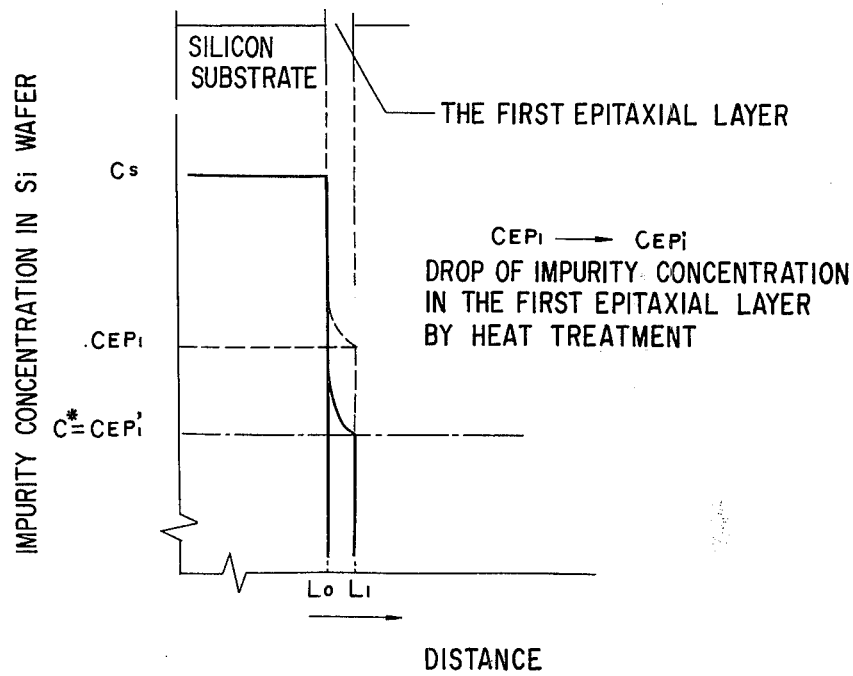

Thus, in the convection layer 4, the concentrations of the source gas and doping gas become zero. The evaporation of highly concentrated arsenic from the silicon substrate 5 is restrained by the first epitaxial layer 8. As a result, the arsenic concentration in the stagnant layer 3 gradually decreases by an amount corresponding to the amount of arsenic diffused in the convection layer 4, as shown in FIG. 5(a). In FIG. 5(a) the reference $t_0$ denotes the time at which epitaxial growth starts, $t_1$ the time for which the first epitaxial growth ends and also the heat treatment process starts, $t_2$ the time at which the heat treatment process ends, $Pt_0$ the arsenic concentration in the stagnant layer 3 immediately before the time $t_0$ at which epitaxial growth starts, $Pt_1$ the arsenic concentration at the end ($t_1$) of the first epitaxial growth process, $Pt_2$ the arsenic concentration at the end ($t_2$) of the heat treatment step, and P* the arsenic concentration in the vapor phase, which is necessary to make the arsenic concentration of the epitaxial layer reach the desired level C*. In the first epitaxial layer 8 the arsenic concentration gradually decreases due to the evaporation of arsenic atoms from the first epitaxial layer surface. This state is shown in FIG. 5(b) wherein the arsenic concentration decreases from $CEP_1$ to $CEP_1'$ as a result of heat treatment for the period ($t_2 - t_1$). The second epitaxial growth step starts at $t_2$ when the arsenic concentration in the stagnant layer 3 reaches a given level P*. The supply of silicon source gas and arseniuretted hydrogen doping gas to give the concentration P* is resumed and epitaxial growth is maintained until the desired wafer characteristic is attained.

Figure 6A:
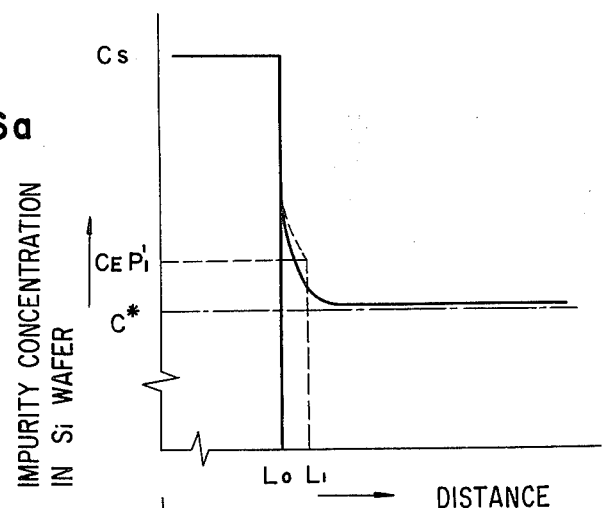
FIGS. 6(a) and 6(b) are diagrams showing inpurity distributions often observed in the boundary of an epitaxial wafer formed by the two-step epitaxial technique.
Figure 6B:
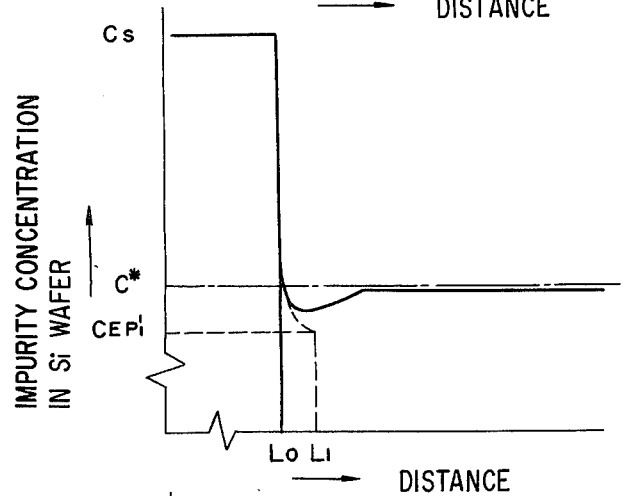

FIGS. 5(a) and 5(b) show an ideal example wherein the time required for the arsenic concentration in the stagnant layer 3 to reach the desired level P* from the level $Pt_1$ equals the time required for the arsenic concentration in the first epitaxial layer 8 to reach the desired level C* from the level $CEP_1$. In practice, the two time intervals often disagree, which leads to a problem as graphically illustrated in FIG. 6(a). FIG. 6(a) is an example wherein the second epitaxial growth starts before the arsenic concentration in the first epitaxial layer 8 duly reaches the level C* for the heat treatment time ($t_2 - t_1$), resulting in a residue of autodoped region, while FIG. 6(b) is an example wherein the arsenic concentration is lowered below the level C* for the time ($t_2 - t_1$), resulting in a depression in the impurity distribution in the boundary. As described above, the prior art two-step epitaxial growth technique involves the problem that the state of changes in the arsenic concentration as time lapses differs in the solid phase and the vapor phase. To make the two states agree with each other, the preparation of a volume of preliminary data, and specialized skill leading to a decision based on the collected data are indispensable. This prior art problem occurs because only a carrier hydrogen gas is supplied in the heat treatment process and, as a consequence, the arsenic concentration in the convection layer 4 becomes zero, and excess heat treatment causes the arsenic concentration in the stagnant layer 3, and the arsenic concentration in the first epitaxial layer 8 which is equilibrated with that in the stagnant layer to be lowered below the desired levels P* and C* respectively.

Figure 7:
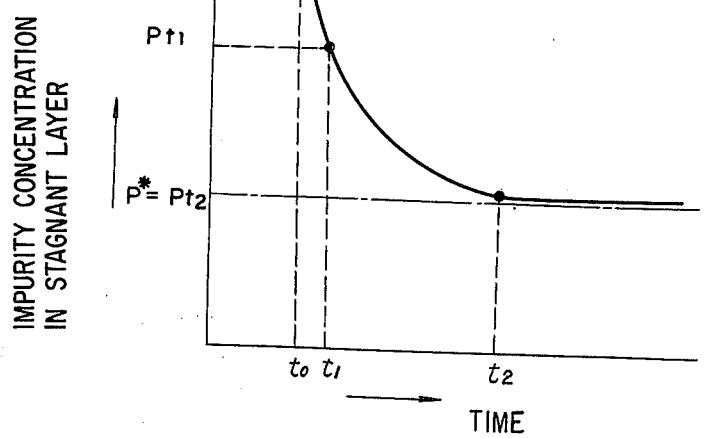
FIG. 7 is a diagram showing changes in a vapor phase in an epitaxial wafer formed by the refined two-step epitaxial growth technique according to the present invention.
Figure 8:
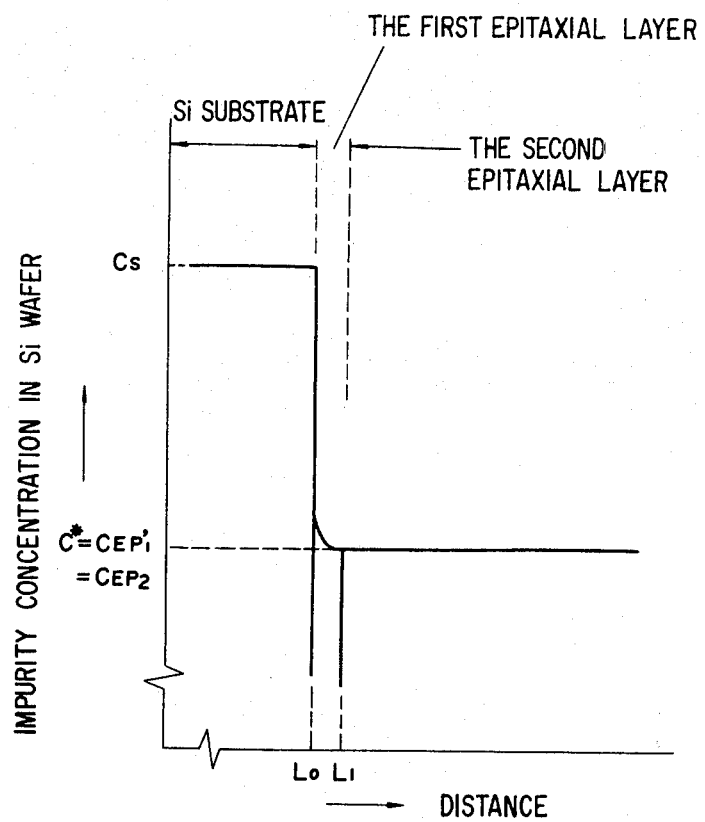
FIG. 8 is a diagram showing an impurity distribution in an epitaxial wafer formed by the two-step epitaxial growth technique according to the present invention.

However, according to the present invention, the supply of only the source gas is stopped where the doping gas, such as $AsH_3$, is kept supplied at a desired concentration in the process of heat treatment. In other words, a carrier gas, such as $H_2$, and a doping gas, such as $AsH_3$, are kept supplied in the heat treatment process. The doping gas which flows in the convection layer 4 is supplied at a desired concentration and hence the arsenic concentration in the stagnant layer 3 which is equilibrated with the doping gas concentration in the convective gas layer does not become lower than the desired level P*. The aresenic concentration in the stagnant layer which changes along the curve indicated by the broken line in FIG. 5(a) does not come down below P* but closely approaches P* as shown in FIG. 7, at which level the equilibrium of arsenic concentration is established in the stagnant layer 3. Accordingly, in the first epitaxial layer, the arsenic concentration which is equilibrated with that in the stagnant layer attains equilibrium at the level C*. This indicates the fact that the arsenic concentrations in both the vapor phase and the solid phase are kept at P* and C* respectively no matter how long the heat treatment may be conducted, and consequently, there are no possibilities of causing a depression in the impurity distribution in the boundary as shown in FIG. 6(b). According to the present invention, no residue of auto-doped region as in FIG. 6(a) occurs because the heat treatment can be applied for a sufficient length of time. Moreover, with the present invention a consant epitaxial process can be maintained regardless of how long the heat treatment is applied. Thus an ideal state of impurity equilibrium can always be established, which eliminates the need for a volume of preliminary experimental data and expert skill which have been indispensable in the prior art. FIG. 8 shows an impurity distribution in a silicon epitaxial wafer formed according to the invention. It is apparent that the autodoping effect is prefectly eliminated in the boundary region. The arsenic concentration $CEP_2$ in the second epitaxial growth layer agrees with the level C*.

Figure 9:
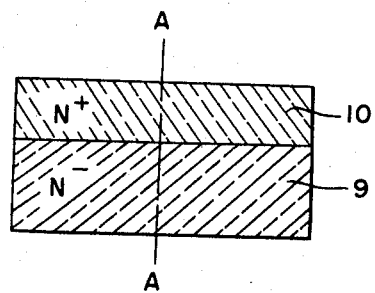
FIG. 9 is a sectional view showing the structure of a wafer wherein an epitaxial layer having a high impurity concentration is formed on a semiconductor substrate having a low impurity concentration by vapor growth.
Figure 10:
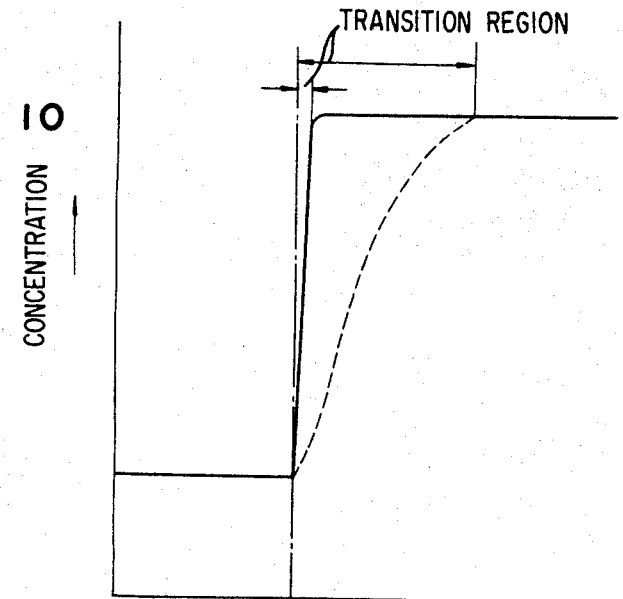
FIG. 10 is a diagram showing an impurity distribution taken along line A—A across the wafer as in FIG. 9.
Figure 11:
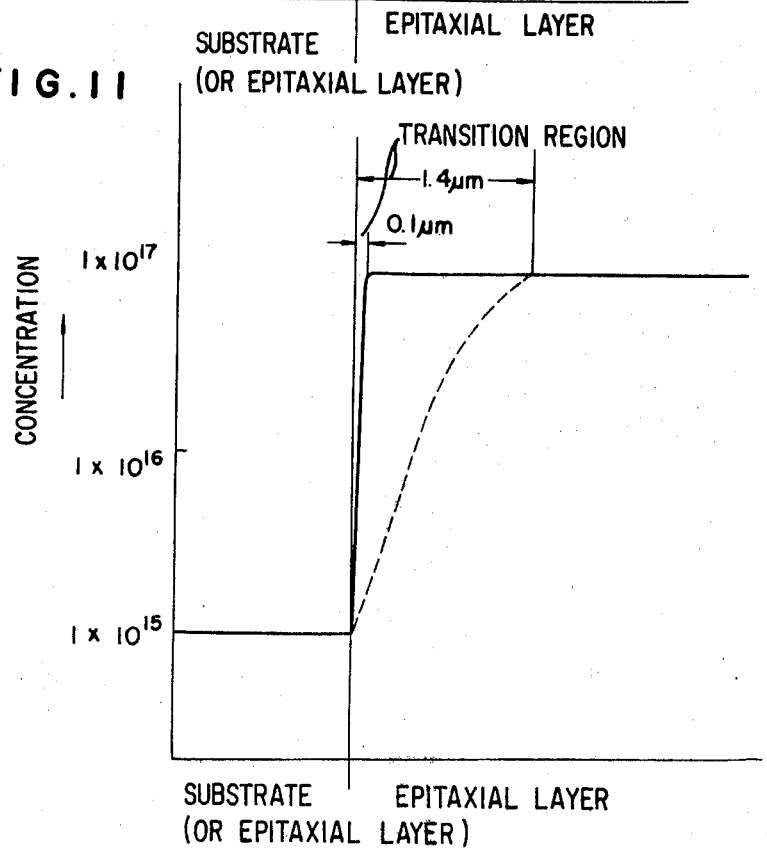
FIG. 11 is a diagram showing an impurity distribution in an epitaxial layer deposited thereon according to an embodiment of the invention, in contrast to the prior art technique.

Referring now to FIGS. 9 through 11, the invention will be further described by way of example wherein an epitaxial layer having a high impurity concentration is formed on a semiconductor substrate having a low impurity concentration.

In this case just the opposite of the autodoping phenomenon occurs. Before the epitaxial growth of the low impurity concentration starts, the impurity concentration in the stagnant layer is low enough compared with the desired doping level in the epitaxial layer. The time delay for the impurity concentration of the stagnant layer to reach the desired concentration yields an undesirable impurity profile at the interface between the two regions with different impurity concentrations. Quick response without time delay of impurity doping is necessary to get a steep impurity profile and the refined two-step epitaxial growth technique is also available to restrain autodilution in the opposite sense.

FIG. 9 is a sectional view of a wafer wherein an epitaxial layer doped with an impurity at a high concentration is deposited on a semiconductor substrate (or another epitaxial layer) having an impurity of low concentration, the deposited epitaxial layer being the same conduction type as the substrate. In FIG. 9, the numeral 9 denotes a semiconductor substrate (or an epitaxial layer) having an impurity of low concentration, and 10 an epitaxial layer having an impurity of high concentration.

FIG. 10 shows an impurity concentration distribution taken along the line A—A across the wafer as shown in FIG. 9. The solid line indicates an impurity concentration distribution in a wafer formed by epitaxial growth according to the method of the present invention, and the broken line indicates an impurity concentration distribution in a wafer formed by epitaxial growth according to the prior art method. It is apparent in FIG. 10 that the autodilution effect is largely diminished in the wafer formed according to the present invention.

A concrete example of a wafer formed by epitaxial growth according to another embodiment of the invention will be described below.

A silicon epitaxial wafer whose impurity concentration is $1 \times 10^{15}$ /cm$^3$ is placed on a susceptor which is inductively heated by a high frequency. The susceptor and the wafer are then installed in a usual horizontal open tube type reaction apparatus. The inside of the reaction apparatus, kept at room temperature, is purged with nitrogen gas supplied at a flow rate of 40 liters per minute for 4 minutes. Hydrogen gas is supplied to the reaction apparatus at a flow rate of 40 liters per minute, and the susceptor is heated to a temperature of 1,050°C. Arsenic tri-hydride, AsH$_3$, gas of 50 ppm is supplied to the reaction apparatus at a flow rate of 30 milliliters per minute. After the flow of these gases for twenty minutes, while the impurity concentration of the stagnant layer sufficiently reaches the desired doping level by the diffusion from the convective layer, 5% of hydrogen silicide SiH$_4$ is additionally supplied thereto at a flow rate of 1,040 milliliters per minute. After the supply of these gases for 20 minutes, only the hydrogen gas is supplied, and heating is maintained for 4 minutes. Then heating is stopped to allow the susceptor to assume room temperature. In experiments, the wafer was taken out of the reaction apparatus and inspected to find that the thickness of the deposited epitaxial layer was 7.0 micron, and the impurity concentration was $1 \times 10^{17}$ /cm$^3$. It was also found that the thickness of the transition region extended from the epitaxial layer whose impurity concentration was $1 \times 10^{17}$ /cm$^3$ was not larger than 0.1 micron. These results are graphically illustrated in FIG. 11 in comparison with those obtained according to the prior art technique; the solid line indicates the impurity concentration distribution obtained according to the present invention; and the broken line, indicates the impurity concentration distribution obtained according to the prior art.

The invention has been described in reference to preferred embodiments wherein a silicon epitaxial layer doped with arsenic is formed by deposition on a silicon substrate doped with arsenic. It is apparent that the invention is not limited to these examples. For instance, the semiconductor material used may be silicon, germanium, gallium arsenide, gallium phosphide or the like. Also, the impurity added may be arsenic, phosphorus, antimony, boron, gallium, aluminum or the like. Further, the impurity added may be the same or different in the substrate and the epitaxial layer.

It is to be understood that the invention is not limited to the horizontal tube tybe reaction apparatus and can be applied to all vapor growth systems in which the gas flows parallel to the wafer surface.

While a few preferred embodiments of the invention have been described in detail, together with specific modifications thereof, it is to be understood that the invention is not limited thereto or thereby.

What is claimed as new and desired to be secured by letters patent of the United States is:

1. A method of forming a semiconductor layer by vapor growth, comprising the steps of:
    forming a second semiconductor layer on a first thin semiconductor layer by vapor growth, the impurity concentration being different but of the same conductivity type in the twp semiconductor layers;
    controlling the impurity concentration level by supplying a carrier gas and a doping gas of given concentrations before the vapor growth of the second semiconductor layer starts;
    maintaining the temperature constant throughout the process.

2. A method of forming a semiconductor layer by vapor growth as in claim 1 wherein the impurity concentration in the second semiconductor layer is higher than in the first semiconductor layer and wherein the impurity distribution is steep in the boundary region.

3. A method of forming a semiconductor layer by vapor growth as in claim 1 wherein the impurity concentration in the second semiconductor layer is lower than in the first semiconductor layer.

4. A method of forming a semiconductor layer by vapor growth comprising the steps of:
    forming a thin semiconductor layer on a semiconductor substrate by vapor growth, the impurity concentration being higher in the thin semiconductor layer than in the semiconductor substrate but of the same conductivity type;
    supplying a carrier gas and a doping gas of a given concentration before the vapor growth of the semiconductor layer starts;
    maintaining the temperature constant throughout the process.

5. A method of forming semiconductor layers by vapor growth, comprising the steps of:
    forming a first thin semiconductor layer on a semiconductor substrate, the impurity concentration being lower in the semiconductor layer than in the semiconductor substrate but of the same conductivity type;
    controlling the impurity concentration level by supplying a carrier gas and a doping gas of a given concentration and ceasing to supply a source gas and applying a heat treatment after the vapor growth of the first semiconductor layer;
    forming a second semiconductor layer on the first thin semiconductor layer by vapor growth after the heat treatment, the impurity concentration being lower in the second semiconductor layer than in the semiconductor substrate;
    maintaining the temperature constant throughout the process.

6. A method of forming semiconductor layers by vapor growth, comprising the steps of:
    supplying a carrier gas, a doping gas, and a source gas onto a semiconductor substrate and thus forming a first thin semiconductor layer on the semiconductor substrate by vapor growth, the impurity concentration being lower in the first thin semiconductor layer than in the semiconductor substrate but of the same conductivity type;

controlling the impurity concentration level by stopping the supply of the source gas after the vapor growth of the first semiconductor layer, but maintaining the supply of the carrier gas and the doping gas in a given concentration and applying heat treatment thereto;

supplying a carrier gas, a doping gas, and a source gas onto the first thin semiconductor layer after the heat treatment, and thus forming a second semiconductor layer by vapor growth, the impurity concentration being lower in the second semiconductor layer than in the semiconductor substrate;

maintaining the temperature constant throughout the process.

* * * * *